US010147864B2

(12) United States Patent
Park et al.

(10) Patent No.: US 10,147,864 B2
(45) Date of Patent: Dec. 4, 2018

(54) FE—NI/TI METALIZED SKUTTERUDITE THERMOELECTRIC MATERIAL AND METHOD OF MANUFACTURING THE SAME

(71) Applicants: KOREA INSTITUTE OF ENERGY RESEARCH, Daejeon (KR); KOREA ADVANCED INSTITUTE OF SCIENCE AND TECHNOLOGY, Daejeon (KR)

(72) Inventors: Sang Hyun Park, Daejeon (KR); Chung-Yul Yoo, Daejeon (KR); Young Hwan Jin, Daejeon (KR); Hana Yoon, Daejeon (KR); Byung jin Cho, Daejeon (KR)

(73) Assignees: KOREA INSTITUTE OF ENERGY RESEARCH, Daejeon (KR); KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 0 days.

(21) Appl. No.: 15/695,006

(22) Filed: Sep. 5, 2017

(65) Prior Publication Data
US 2018/0294400 A1 Oct. 11, 2018

(30) Foreign Application Priority Data

Apr. 11, 2017 (KR) .................. 10-2017-0046694

(51) Int. Cl.
*H01L 35/12* (2006.01)
*H01L 37/02* (2006.01)
(Continued)

(52) U.S. Cl.
CPC .......... *H01L 37/025* (2013.01); *B32B 15/043* (2013.01); *B32B 2038/0092* (2013.01); *B32B 2309/105* (2013.01)

(58) Field of Classification Search
CPC ......... H01L 35/18; H01L 35/34; B32B 15/01; B32B 15/043; B32B 2038/0092; B32B 2309/105
(Continued)

(56) References Cited

U.S. PATENT DOCUMENTS 4,855,810 A 8/1989 Gelb et al.
2011/0284523 A1* 11/2011 Hiroyama ............... H01L 35/08
219/603
(Continued)

FOREIGN PATENT DOCUMENTS

JP 2010165847 A 7/2010
JP 2017045840 A 3/2017
(Continued)

OTHER PUBLICATIONS

Byeongcheol Song et al., "The effects of diffusion barrier layers on the microstructural and electrical properties in CoSb3 thermoelectric modules", Journal of Alloys and Compounds, Jul. 16, 2014, pp. 160-162, vol. 617, Elsevier B.V.
Korean Office Action for corresponding Korean Patent Application No. 10-2017-0046694 dated Aug. 13, 2018.

*Primary Examiner* — Susan D Leong
*Assistant Examiner* — Dujuan A Horton
(74) *Attorney, Agent, or Firm* — Cantor Colburn LLP

(57) ABSTRACT

This invention relates to a metalized skutterudite thermoelectric material having improved long-term stability and a method of manufacturing the same, wherein the skutterudite thermoelectric material is metalized with a multilayer structure including a Ti layer for preventing the diffusion of the skutterudite thermoelectric material and a Fe—Ni layer for preventing an increase in the thickness of an intermetallic compound layer, whereby the performance of the skutterudite thermoelectric material does not deteriorate due to diffusion and formation of the intermetallic compound even
(Continued)

upon long-term use, thus exhibiting improved stability of use, and moreover, the lifetime and stability of a thermoelectric power generation module using the skutterudite thermoelectric material can be increased, whereby the power generation efficiency of the thermoelectric power generation module can be increased in the long term.

9 Claims, 11 Drawing Sheets

(51) Int. Cl.
    *B32B 15/04*     (2006.01)
    *B32B 38/00*     (2006.01)

(58) Field of Classification Search
    USPC .................................................. 136/200–242
    See application file for complete search history.

(56) References Cited

U.S. PATENT DOCUMENTS

| | | | |
|---|---|---|---|
| 2014/0096809 A1* | 4/2014 | Kim | H01L 35/16 136/205 |
| 2014/0109948 A1* | 4/2014 | Lee | H01L 35/08 136/203 |
| 2015/0171304 A1* | 6/2015 | Ballinger | H01L 35/34 136/200 |
| 2016/0163948 A1 | 6/2016 | Wang | |

FOREIGN PATENT DOCUMENTS

| | | |
|---|---|---|
| KR | 1020070004950 A | 1/2007 |
| KR | 1020170011622 A | 2/2017 |

\* cited by examiner

FE—NI/TI METALIZED SKUTTERUDITE THERMOELECTRIC MATERIAL AND METHOD OF MANUFACTURING THE SAME

CROSS-REFERENCE TO RELATED APPLICATION

This application claims the priority benefit of Korean Patent Application No. 10-2017-0046694, filed on Apr. 11, 2017 in the Korean Intellectual Property Office, the disclosure of which is incorporated herein by reference.

BACKGROUND OF THE INVENTION

This work was conducted under the framework of the Research and Development Program of the Korea Institute of Energy Research (KIER, B7-2416-01). This research was also supported by the National Research Foundation of Korea (NRF) Grant funded by the Korean Government (MSIP) (NRF-2015R1A5A1036133).

1. Technical Field

The present invention relates to a metalized thermoelectric material for use in a thermoelectric power generation module and a method of manufacturing the same, and more particularly to a metalized skutterudite thermoelectric material and a method of manufacturing the same.

2. Description of the Related Art

Typically, a thermoelectric material, which is able to convert thermal energy into electrical energy, is used to constitute a thermoelectric power generation module so as to realize thermoelectric power generation. The thermoelectric power generation technique is an energy-harvesting process for converting thermal energy into electrical energy, and is also receiving attention in the field of renewable energy technology because it may be used in industrial sites and any places where waste heat may be generated.

The thermoelectric power generation technique, a low-efficiency energy conversion technology that has been known for decades, is reported to exhibit efficiency of 10% or more in the mid-temperature (300 to 700° C.) range, and is receiving great attention as a novel energy regeneration process, and thus thorough research thereto is ongoing at home and abroad. Among various thermoelectric materials, a skutterudite (SKD) thermoelectric material is a promising material that exhibits superior thermoelectric and mechanical properties in the mid-temperature range, and thus mid-temperature thermoelectric power generation modules using skutterudite are being developed by institutes worldwide. Here, a metalization process, which is regarded as a key process in the mid-temperature thermoelectric power generation modules, is to form a metal layer on the surface of the thermoelectric material. The metal layer blocks mechanical cracking owing to a difference in coefficient of thermal expansion between a thermoelectric material and an electrode upon junction therebetween and prevents the continuous diffusion of a junction interface in the mid-temperature range.

SUMMARY OF THE INVENTION

Accordingly, the present invention has been made keeping in mind the problems encountered in the related art, and the present invention is intended to provide a metalized skutterudite thermoelectric material and a method of manufacturing the same, in which the long-term stability of the skutterudite thermoelectric material may be increased.

Therefore, the present invention provides a metalized skutterudite thermoelectric material comprising a metalization layer formed on the surface thereof, wherein the metalization layer is configured such that a Fe—Ni layer and a Ti layer are sequentially stacked (FIG. 1).

A Ti metallization layer, which is able to significantly prevent the diffusion of elements for the skutterudite thermoelectric material, upon long-term use at high temperatures, causes an intermetallic compound layer to become thick to thus incur deteriorated performance. Hence, according to the present invention, there is provided a Fe—Ni/Ti metalized skutterudite thermoelectric material, which includes a metalization layer configured such that a Fe—Ni layer is formed on the thermoelectric material and a Ti layer is disposed thereon.

As used herein, the term "skutterudite thermoelectric material" refers not only to a skutterudite thermoelectric material composed of $CoSb_3$ or $FeSb_3$ but also to all skutterudite-based materials in which typical compositions are added or doped with various materials.

Here, the Fe—Ni layer is preferably composed of Fe and Ni at a weight ratio ranging from 75:25 to 55:45.

When the thickness of the Fe—Ni layer is 40 µm or more, an intermetallic compound layer may be appropriately formed and the Fe—Ni layer may also function as a thermal expansion buffer layer. The upper limit of the thickness of the Fe—Ni layer is not particularly limited, but is preferably 150 µm or less taking into consideration the manufacturing cost.

When the thickness of the Ti layer is 40 µm or more, the Ti layer may function as a diffusion barrier layer. The upper limit of the thickness of the Ti layer is not particularly limited, but is preferably 150 µm or less considering the manufacturing cost.

In addition, the present invention provides a Fe—Ni/Ti multilayered metallization structure for a skutterudite thermoelectric material, in which the metalization structure is formed on the surface of the skutterudite thermoelectric material and includes a Fe—Ni layer formed on the skutterudite thermoelectric material and a Ti layer formed on the Fe—Ni layer.

Here, the Fe—Ni layer is preferably composed of Fe and Ni at a weight ratio ranging from 75:25 to 55:45.

When the thickness of the Fe—Ni layer is 40 µm or more, an intermetallic compound layer may be appropriately formed and the Fe—Ni layer may also play a role as a thermal expansion buffer layer. The upper limit of the thickness of the Fe—Ni layer is not particularly limited, but is preferably 150 µm or less taking into consideration the manufacturing cost.

When the thickness of the Ti layer is 40 µm or more, the Ti layer may function as a diffusion barrier layer. The upper limit of the thickness of the Ti layer is not particularly limited, but is preferably 150 µm or less in consideration of the manufacturing cost.

In addition, the present invention provides a method of metalizing a skutterudite thermoelectric material, suitable for performing metalization treatment on the surface of a skutterudite thermoelectric material, the method comprising forming, on the surface of a skutterudite thermoelectric material, a metalization layer configured such that a Fe—Ni layer and a Ti layer are sequentially stacked.

Specifically, the method of manufacturing a Fe—Ni/Ti metalized skutterudite thermoelectric material according to the present invention is characterized in that the metalization layer comprising the Fe—Ni layer and the Ti layer, sequentially stacked, is formed on the surface of the skutterudite thermoelectric material.

Since the Ti metallization layer, which is able to significantly prevent the diffusion of elements for the skutterudite thermoelectric material, upon long-term use at high temperatures, causes an intermetallic compound layer to become thick to thus incur deteriorated performance, the present invention provides a method of forming a metalization layer configured such that a Fe—Ni layer is formed on the thermoelectric material and a Ti layer is disposed thereon.

When the Fe—Ni layer contains Fe and Ni at a weight ratio ranging from 75:25 to 55:45, the thickness of the intermetallic compound may be prevented from increasing due to the reaction with the skutterudite thermoelectric material.

In the formation of the metalization layer having a multilayer structure comprising a Fe—Ni layer and a Ti layer, the Fe—Ni layer and the Ti layer may be sequentially formed on the surface of the skutterudite thermoelectric material, or a Fe—Ni metal foil and a Ti metal foil may be sequentially superimposed on the surface of the skutterudite thermoelectric material and hot pressed.

In addition, the method of manufacturing a Fe—Ni/Ti metalized skutterudite thermoelectric material includes preparing the skutterudite thermoelectric material by sintering a skutterudite powder. The Fe—Ni foil and the Ti foil are sequentially superimposed on the skutterudite powder and pressure sintered, whereby the skutterudite powder is sintered, and at the same time, the metalization layer comprising the Fe—Ni layer and the Ti layer, sequentially stacked, is formed on the surface of the skutterudite thermoelectric material.

According to the present invention, a metalized skutterudite thermoelectric material is configured to include a multilayer structure comprising a Ti layer for preventing the diffusion of the skutterudite thermoelectric material and a Fe—Ni layer that prevents the intermetallic compound layer from being thickened. Thereby, even when the skutterudite thermoelectric material is used over the long term, performance deterioration owing to the diffusion and the formation of the intermetallic compound does not occur, thus increasing stability of use.

Ultimately, a thermoelectric power generation module using the skutterudite thermoelectric material is increased in lifetime and stability, thus increasing power generation efficiency of the thermoelectric power generation module in the long term.

DESCRIPTION OF SPECIFIC EMBODIMENTS

Hereinafter, a detailed description will be given of embodiments of the present invention with reference to the appended drawings.

The present inventors have ascertained the problems caused when a Ti layer having high diffusion barrier properties is provided alone during the fabrication of a thermoelectric power generation module using a skutterudite thermoelectric material.

Figure 1:
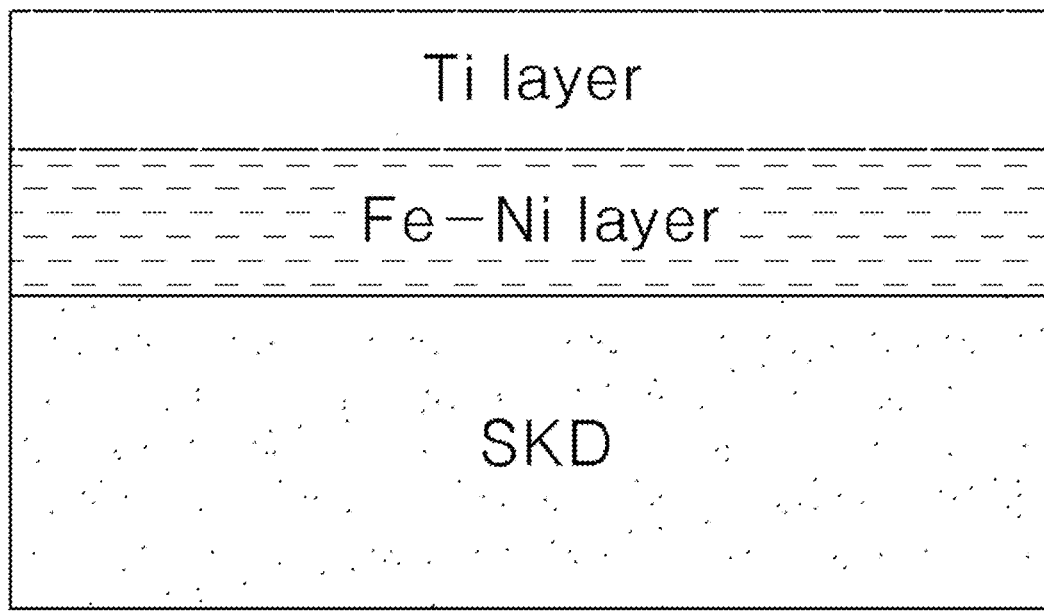
FIG. 1 is a schematic view showing that a Fe—Ni/Ti multilayered metalization structure is formed on the surface of a skutterudite thermoelectric material according to an embodiment of the present invention.
Figure 2A:
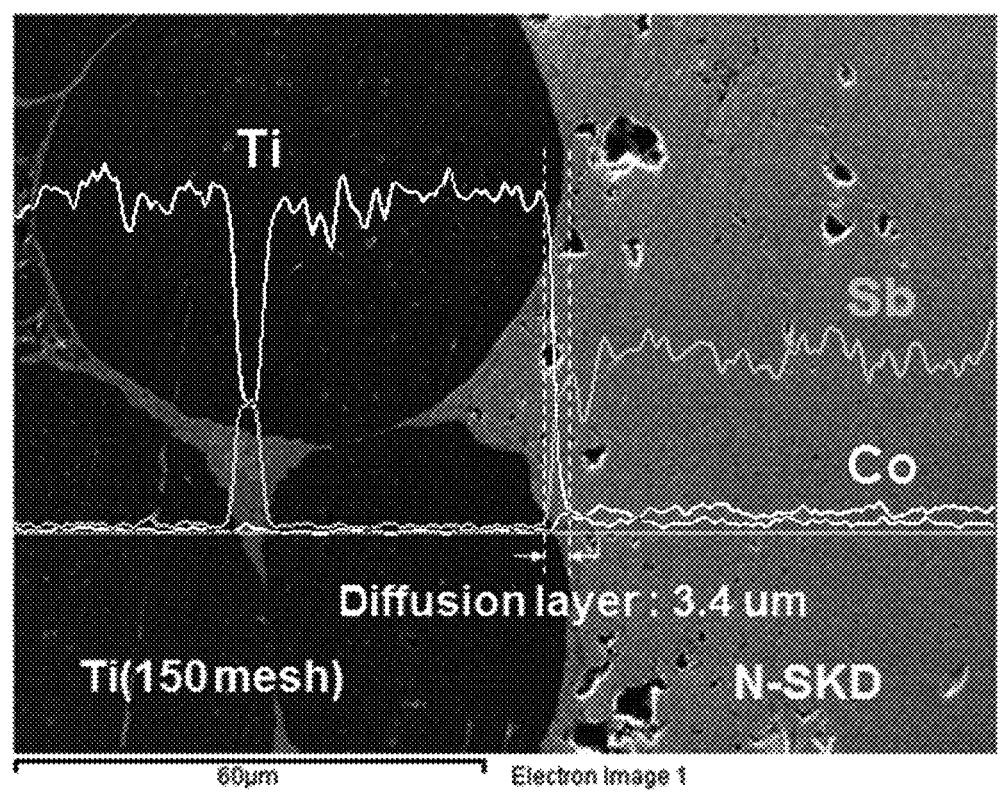
FIG. 2A shows the results of EDS (Energy Dispersive X-ray Spectroscopy) when the surface of an n-type skutterudite thermoelectric material is metalized with a Ti powder.
Figure 2B:
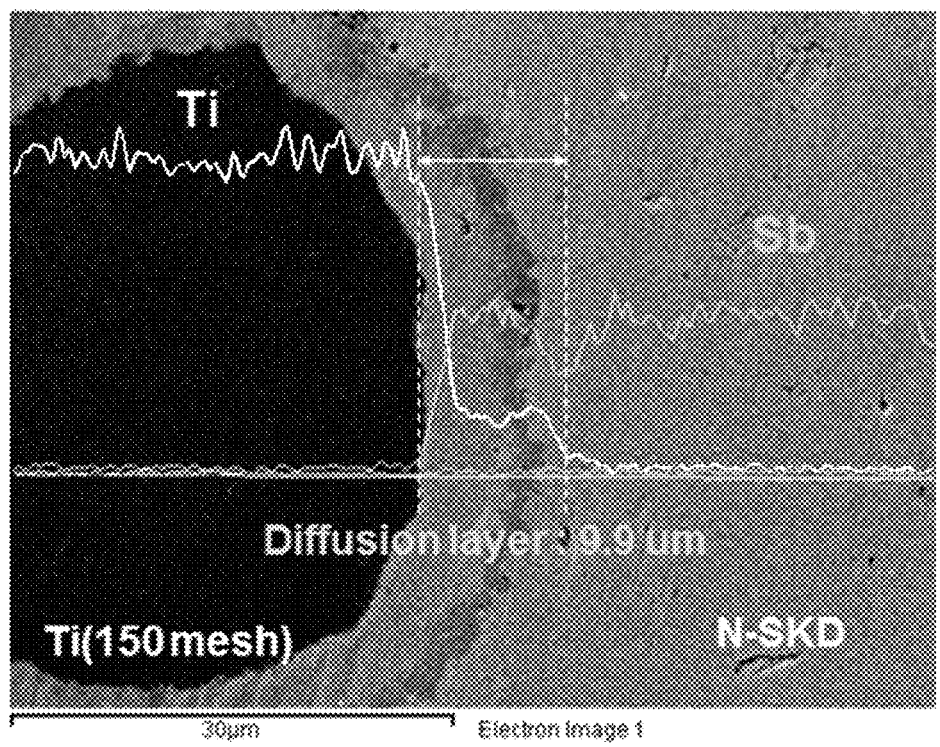
FIG. 2B shows the results of EDS after thermal treatment of the metalized skutterudite thermoelectric material of FIG. 2A at 500° C. for 10 hr.

FIG. 2A shows the results of EDS when the surface of an n-type skutterudite thermoelectric material is metalized with a Ti powder, and FIG. 2B shows the results of EDS after thermal treatment of the metalized skutterudite thermoelectric material of FIG. 2A at 500° C. for 10 hr.

As shown in FIG. 2A, in which n-type skutterudite is metalized with the Ti powder by applying a pressure of 50 MPa at 650° C. for 10 min, the thickness of the diffusion layer was measured to be 3.4 μm through composition analysis.

In order to reproduce the environment in which the thermoelectric power generation module using the thermoelectric material is applied, thermal treatment was performed at 500° C. for 10 hr while maintaining a vacuum atmosphere. As shown in FIG. 2B, the thickness of the diffusion layer was increased to 9.9 μm.

The diffusion layer is configured such that elements of skutterudite are diffused to thus form an intermetallic compound with Ti. As seen in FIG. 2A, when the surface of the skutterudite thermoelectric material is metalized with the Ti layer, the intermetallic compound is synthesized upon real-world application, and thus the thickness of the intermetallic compound layer is increased. Since the intermetallic compound, which is formed between the Ti layer and the skutterudite thermoelectric material, has high contact resistance, the thickness of the intermetallic compound layer has to be appropriately adjusted in order to obtain desired efficiency. Even when the intermetallic compound layer is first formed at an adequately controlled thickness, the thickness thereof may increase during actual usage, and thus the contact resistance between the metalization layer and the skutterudite thermoelectric material may increase, ultimately reducing power generation efficiency, which is undesirable. Hence, the skutterudite thermoelectric material metalized with the Ti layer may suffer from stability problems upon long-term use thereof.

Therefore, the present inventors have developed a multilayered metalization structure for use in a skutterudite thermoelectric material, which is configured such that a Fe—Ni layer is interposed between the skutterudite thermoelectric material and the Ti layer having high diffusion barrier performance.

Figure 3:
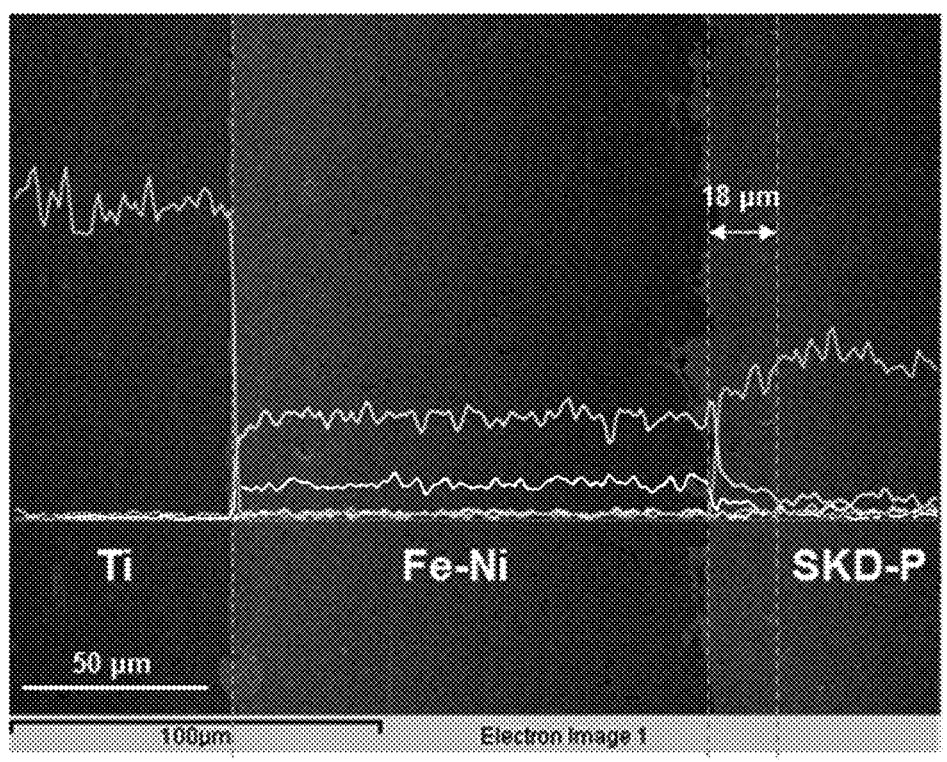
FIG. 3 shows the results of EDS of a p-type skutterudite thermoelectric material including a Fe—Ni/Ti multilayered metalization structure according to an embodiment of the present invention.
Figure 4:
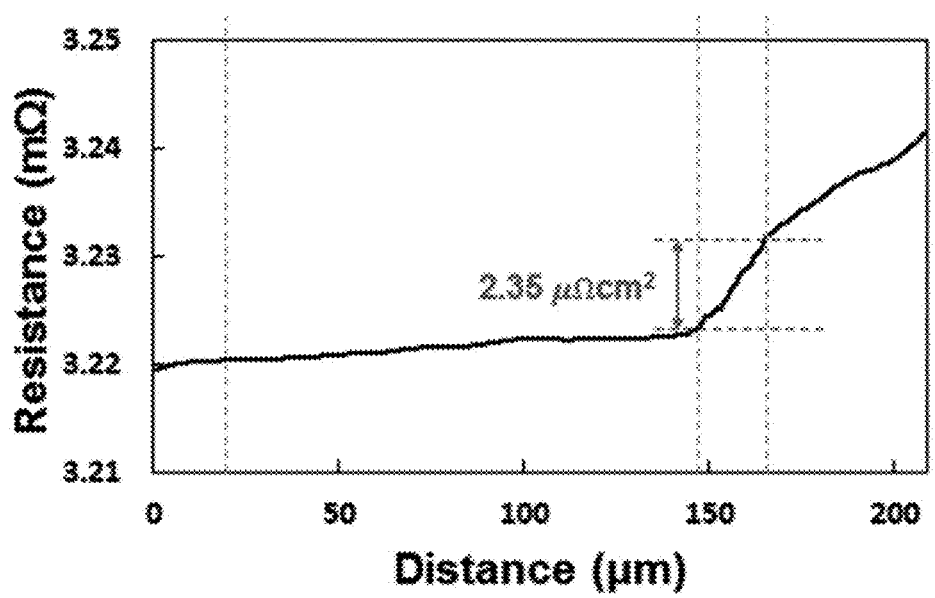
FIG. 4 shows the results of measurement of contact resistance of the metalized p-type skutterudite thermoelectric material of FIG. 3.

FIG. 3 shows the results of EDS of a p-type skutterudite thermoelectric material including a Fe—Ni/Ti multilayered metalization structure according to an embodiment of the present invention, and FIG. 4 shows the results of measurement of contact resistance of the metalized p-type skutterudite thermoelectric material of FIG. 3.

Figure 5:
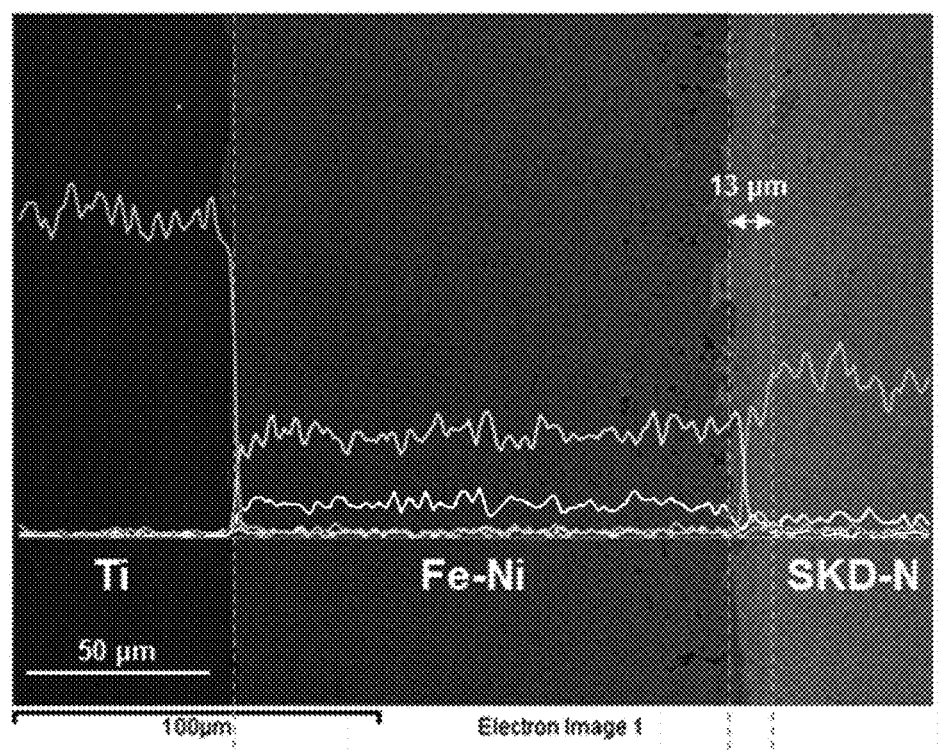
FIG. 5 shows the results of EDS of an n-type skutterudite thermoelectric material including a Fe—Ni/Ti multilayered metalization structure according to an embodiment of the present invention.
Figure 6:
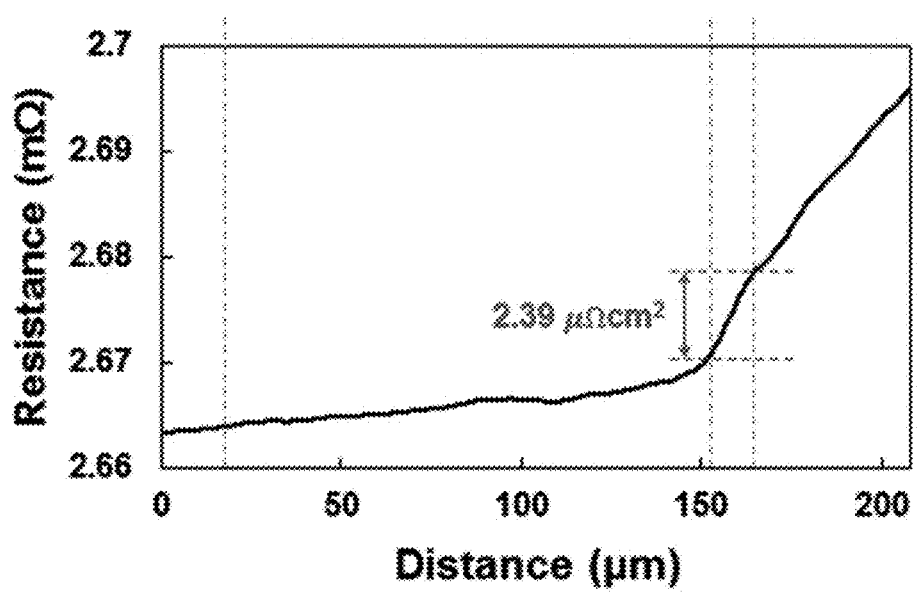
FIG. 6 shows the results of measurement of contact resistance of the metalized n-type skutterudite thermoelectric material of FIG. 5.

FIG. 5 shows the results of EDS of an n-type skutterudite thermoelectric material including a Fe—Ni/Ti multilayered metalization structure according to an embodiment of the present invention, and FIG. 6 shows the results of measurement of contact resistance of the metalized n-type skutterudite thermoelectric material of FIG. 5.

The p-type skutterudite thermoelectric material powder comprising $FeSb_3$ doped with an additive was subjected to pressure sintering, such as SPS (Spark Plasma Sintering), at 650° C. under a pressure of 50 MPa for 10 min. In this procedure, the powder was stacked with a Fe—Ni foil and a Ti foil, whereby the skutterudite thermoelectric material was sintered and simultaneously a metalization layer comprising a Fe—Ni layer and a Ti layer was formed on the surface of the skutterudite thermoelectric material. For an n-type skutterudite thermoelectric material comprising $CoSb_3$ doped with an additive, the metalization layer comprising a Fe—Ni layer and a Ti layer was formed at the same time as the sintering process, and the SPS process was performed at 650° C. and a pressure of 50 MPa for 10 min.

For the p-type skutterudite thermoelectric material, an intermetallic compound layer having a thickness of 18 μm was formed at an interface between the Fe—Ni layer and the skutterudite, and for the n-type skutterudite thermoelectric material, an intermetallic compound layer having a thickness of 13 μm was formed at an interface between the Fe—Ni layer and the skutterudite. In these two cases, low contact resistance of about $10^{-6}$ $\Omega cm^2$ was measured, resulting in low electrical loss.

Figure 7:
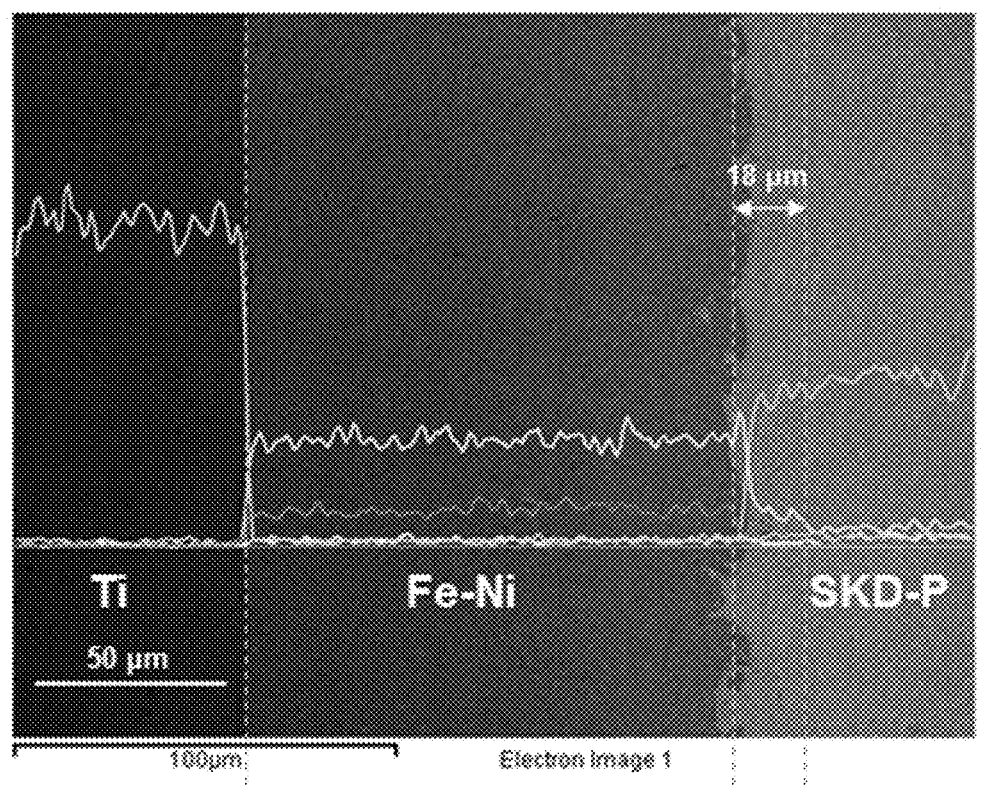
FIG. 7 shows the results of EDS after thermal treatment of the metalized p-type skutterudite thermoelectric material of FIG. 3 at 500° C. for 10 hr.
Figure 8:
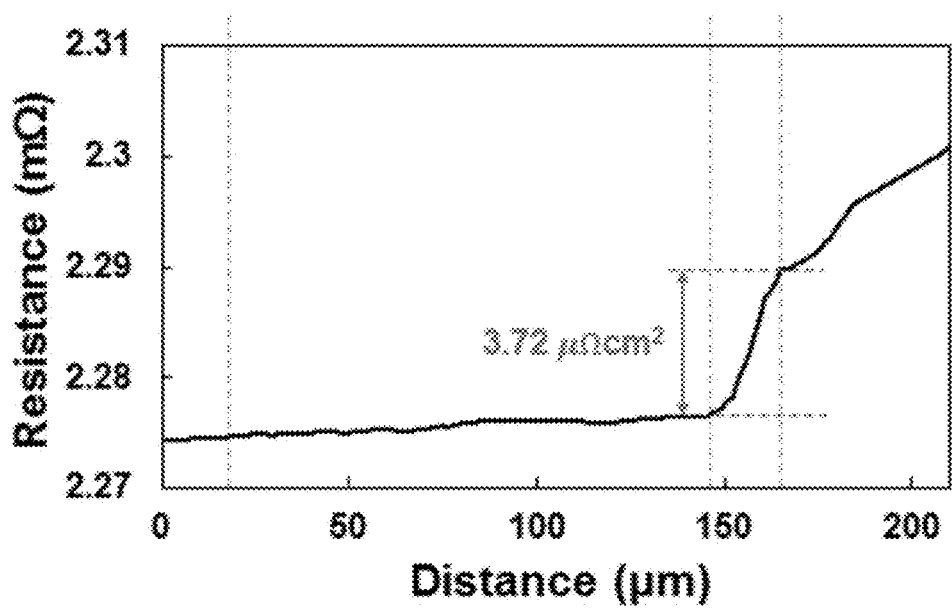
FIG. 8 shows the results of measurement of contact resistance of the metalized p-type skutterudite thermoelectric material of FIG. 7.

FIG. 7 shows the results of EDS after thermal treatment of the metalized p-type skutterudite thermoelectric material of FIG. 3 at 500° C. for 10 hr, and FIG. 8 shows the results of measurement of contact resistance of the metalized p-type skutterudite thermoelectric material of FIG. 7.

Figure 9:
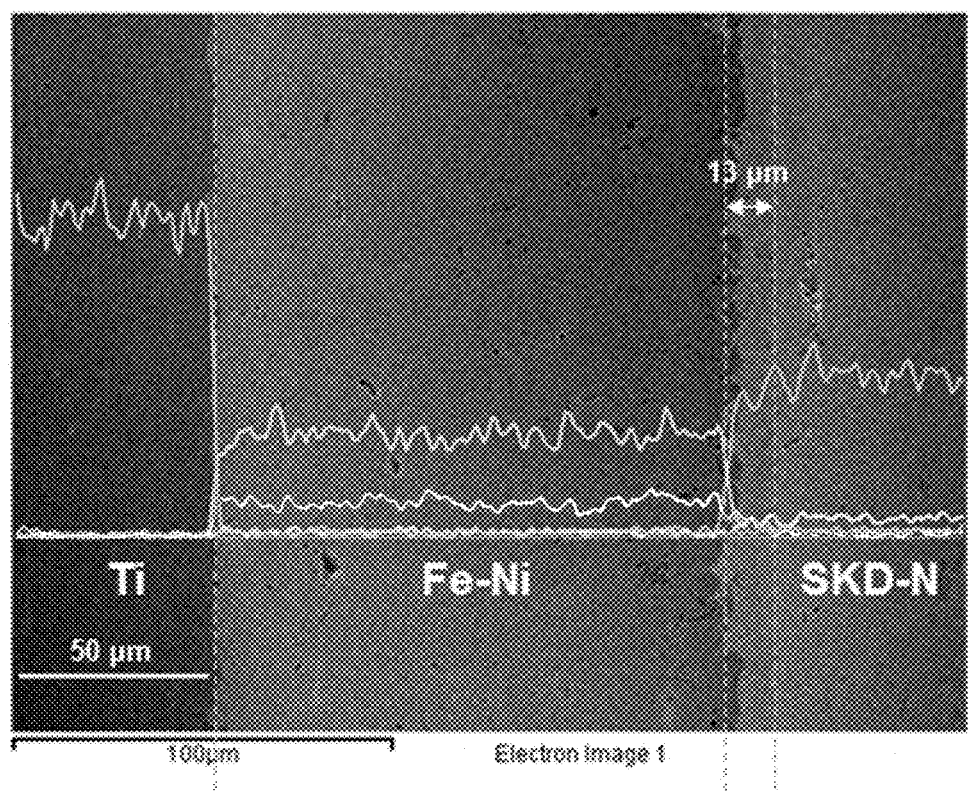
FIG. 9 shows the results of EDS after thermal treatment of the metalized n-type skutterudite thermoelectric material of FIG. 5 at 500° C. for 10 hr.
Figure 10:
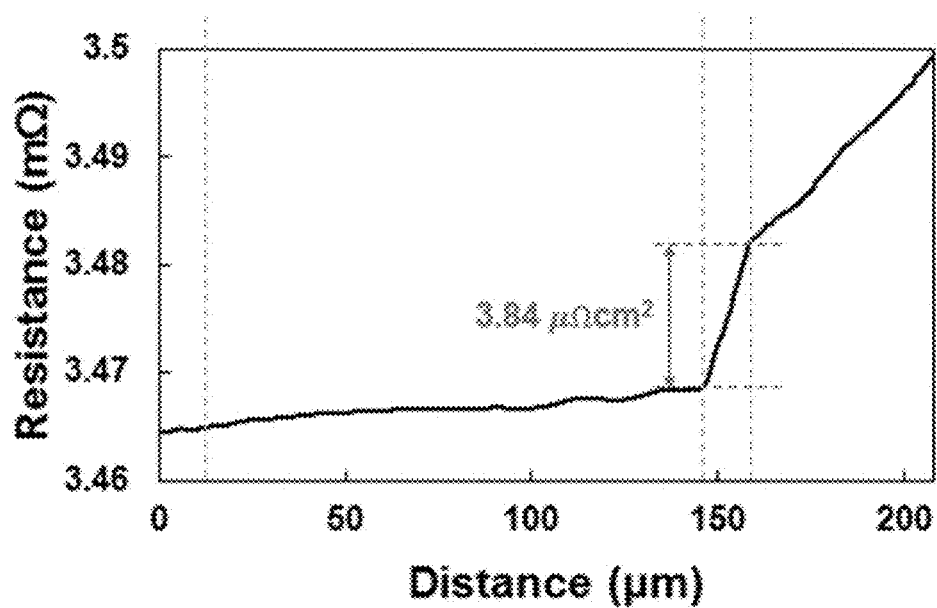
FIG. 10 shows the results of measurement of contact resistance of the metalized n-type skutterudite thermoelectric material of FIG. 9.

FIG. 9 shows the results of EDS after thermal treatment of the metalized n-type skutterudite thermoelectric material of FIG. 5 at 500° C. for 10 hr, and FIG. 10 shows the results of measurement of contact resistance of the metalized n-type skutterudite thermoelectric material of FIG. 9.

Unlike the above Ti layer, the Fe—Ni layer contained in the multilayered metalization structure according to the present embodiment is characterized in that there are no changes in thickness of the intermetallic compound layer despite the same thermal treatment. The contact resistance was slightly increased through thermal treatment, but was still low, to the level of $10^{-6}$ $\Omega cm^2$, resulting in no great changes in electrical loss.

In the present embodiment, microcracking and peeling did not occur at the interface between the skutterudite thermoelectric material and the Fe—Ni metalization layer, and very low contact resistance was measured at the interface therebetween, whereby little power loss can be anticipated. Upon thermal treatment for 10 hr at 500° C., similar to the actual use temperature of the thermoelectric device, there was no significant increase in the thickness of the interfacial layer or in the contact resistance. Accordingly, a thermoelectric device having high reliability can be confirmed to be obtained by forming the Fe—Ni layer between the skutterudite thermoelectric material and the Ti metalization layer.

In this embodiment, the Fe—Ni layer was composed of a Fe—Ni alloy comprising Fe and Ni at a weight ratio of 65:35.

Here, the reason why the Fe—Ni alloy is interposed between the Ti layer and the thermoelectric material is that there are differences in properties and performance when Fe or Ni is used alone compared to when the Fe—Ni alloy is used.

When the Fe layer or the Ni layer, in which Fe or Ni is used alone, is interposed between the Ti layer and the skutterudite thermoelectric material, a thick intermetallic compound layer, and thus high contact resistance, may result, compared to when the Fe—Ni alloy is used. Furthermore, problems in which the thickness of the intermetallic compound layer is increased due to thermal treatment still occur. In the case where the Fe layer or the Ni layer is used alone, the formation of the intermetallic compound is deemed to actively progress between the Fe layer or the Ni layer and the thermoelectric material, as in the Ti layer. On the other hand, when the Fe—Ni alloy is applied, Fe and Ni are coupled with each other and thus Fe and Ni contained in the alloy require the energy to be able to break the Fe—Ni bond in order to directly combine with the thermoelectric material. Hence, the formation of the intermetallic compound is regarded as comparatively difficult.

Also, when the Fe layer or the Ni layer is interposed between the Ti layer and the skutterudite thermoelectric material, the metalization layer may crack. This is considered to be due to a difference in coefficient of thermal expansion between Fe or Ni when used alone and the skutterudite thermoelectric material. On the other hand, when the Fe—Ni alloy is applied, a difference in coefficient of thermal expansion from the skutterudite thermoelectric material is small, and thus no cracking occurs.

Consequently, in this embodiment, the Fe—Ni/Ti multilayered metalization structure is applied. When the Fe—Ni alloy is composed of Fe and Ni at a weight ratio ranging from 75:25 to 55:45, the thickness of the intermetallic compound layer is not increased, but is maintained.

Also, in the present invention, the Fe—Ni layer and the Ti layer, which constitute the Fe—Ni/Ti multilayered metalization structure, are formed to respective thicknesses of 40 μm or more. Thereby, the Ti layer may play a role in sufficiently performing a diffusion barrier function, and the Fe—Ni layer may satisfactorily function between the Ti layer and the skutterudite thermoelectric material and may also function as a thermal expansion buffer layer. Taking into account the formation of the intermetallic compound layer at the interface between the Fe—Ni layer and the skutterudite thermoelectric material, which are in contact with each other, when the Fe—Ni layer is deposited to a sufficient thickness of 50 μm or more, the thickness of the Fe—Ni layer, which is left behind after the formation of the intermetallic compound, may be 40 μm or more. The upper limits of the thicknesses of the Fe—Ni layer and the Ti layer are not particularly limited, and may be set to 150 μm or less in order to avoid increased material costs and because the properties may deteriorate when being excessively thick.

According to the present invention, forming the multilayered metalization structure on the surface of skutterudite may be conducted using a variety of conventional processes without limitation. In particular, individual layers of the multilayered metalization structure may be sequentially stacked and formed using various deposition processes and hot pressing, and metal foils are superimposed and may be metalized all at once through a process such as hot pressing.

In addition to the formation of the multilayered metalization structure on the surface of the skutterudite thermoelectric material produced in the form of an ingot, it is possible to form the multilayered metalization structure by performing a hot pressing process while the skutterudite thermoelectric material in a powder phase is sintered and manufactured in the form of an ingot, as described above.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, the scope of the present invention should be interpreted not by specific embodiments but by the accompanying claims, and it is to be understood that all technical ideas within the claims fall within the purview of the present invention.

What is claimed is:

1. A Fe—Ni/Ti metalized skutterudite thermoelectric material, comprising a metalization layer formed on a surface thereof, wherein the metalization layer is configured such that a Fe—Ni layer and a Ti layer are sequentially stacked,
   wherein the skutterudite thermoelectric material comprises $FeSb_3$ as a p-type thermoelectric material or $CoSb_3$ as an n-type thermoelectric material, and
   wherein the Fe—Ni layer comprises Fe and Ni at a weight ratio ranging from 75:25 to 55:45.

2. The Fe—Ni/Ti metalized skutterudite thermoelectric material of claim 1, wherein the Fe—Ni layer has a thickness of 40 µm or more.

3. The Fe—Ni/Ti metalized skutterudite thermoelectric material of claim 2, wherein the Fe—Ni layer has a thickness of 150 µm or less.

4. The Fe—Ni/Ti metalized skutterudite thermoelectric material of claim 1, wherein the Ti layer has a thickness of 40 µm or more.

5. The Fe—Ni/Ti metalized skutterudite thermoelectric material of claim 4, wherein the Ti layer has a thickness of 150 µm or less.

6. A method of manufacturing a Fe—Ni/Ti metalized skutterudite thermoelectric material, comprising forming, on a surface of a skutterudite thermoelectric material, a metalization layer configured such that a Fe—Ni layer and a Ti layer are sequentially stacked,
   wherein the skutterudite thermoelectric material comprises $FeSb_3$ as a p-type thermoelectric material or $CoSb_3$ as an n-type thermoelectric material, and
   wherein the Fe—Ni layer comprises Fe and Ni at a weight ratio ranging from 75:25 to 55:45.

7. The method of claim 6, wherein the forming the metalization layer is performed by sequentially forming the Fe—Ni layer and the Ti layer on the surface of the skutterudite thermoelectric material.

8. The method of claim 6, wherein the forming the metalization layer is performed in a manner in which a Fe—Ni metal foil and a Ti metal foil are sequentially superimposed on the surface of the skutterudite thermoelectric material and hot pressed.

9. The method of claim 6, wherein the forming the metalization layer is performed in a manner in which a Fe—Ni foil and a Ti foil are sequentially superimposed on a skutterudite powder and pressure sintered, whereby the skutterudite powder is sintered, and simultaneously, the metalization layer, configured such that the Fe—Ni layer and the Ti layer are sequentially stacked, is formed on the surface of the skutterudite thermoelectric material.

* * * * *